United States Patent
Cheng et al.

(10) Patent No.: US 7,123,518 B2
(45) Date of Patent: Oct. 17, 2006

(54) MEMORY DEVICE

(75) Inventors: Ching-Hung Cheng, Hsinchu (TW);
Nai-Chen Peng, Hsinchu (TW);
Chung-Chin Shih, Jhubei (TW);
Tzyh-Cheang Lee, Hsinchu (TW)

(73) Assignee: United Microelectronics Crop.,
Hsinchu (TW)

( * ) Notice: Subject to any disclaimer, the term of this patent is extended or adjusted under 35 U.S.C. 154(b) by 0 days.

(21) Appl. No.: 10/996,204

(22) Filed: Nov. 22, 2004

(65) Prior Publication Data
US 2006/0109713 A1    May 25, 2006

(51) Int. Cl.
*G11C 16/04*    (2006.01)
(52) U.S. Cl. ............................ 365/185.28; 365/185.29; 365/185.17
(58) Field of Classification Search ...................... None
See application file for complete search history.

(56) References Cited

U.S. PATENT DOCUMENTS

| | | | | |
|---|---|---|---|---|
| 6,163,049 A | * | 12/2000 | Bui ............................ | 257/321 |
| 6,477,088 B1 | * | 11/2002 | Ogura et al. ........... | 365/185.29 |
| 6,859,397 B1 | * | 2/2005 | Lutze et al. ........... | 365/185.28 |
| 6,925,007 B1 | * | 8/2005 | Harari et al. .......... | 365/185.15 |

* cited by examiner

*Primary Examiner*—David Lam
(74) *Attorney, Agent, or Firm*—J.C. Patents

(57) ABSTRACT

A memory device including a plurality of word lines, a plurality of bit lines, at least four control lines and a plurality of memory cells is provided. The bit lines are disposed in a perpendicular direction of the word lines. Each memory cell is disposed at an intersection of one of the word lines and one of the bit lines, and every four sequential memory cells having a common word line are connected to the four control lines respectively. In addition, in each of the memory cells, the control line thereof is disposed between the bit line thereof and the word line thereof, and is parallel to the bit line thereof, wherein each of the memory cell is provided as a bit.

15 Claims, 5 Drawing Sheets

| | $WL_K$ | $WL_{K+1}$ | $BL_M$ | $BL_{M+1}$ | $BL_{M+2}$ | $BL_{M+3}$ | $BL_{M+4}$ | $AG_0$ | $AG_1$ | $AG_2$ | $AG_3$ |
|---|---|---|---|---|---|---|---|---|---|---|---|
| PGM | 5V | 0V | 4.5V | 4.5V | floating | 0V | 0V | 0V | 5V | 1V | 8V |
| ERS(I) | -5V | 0V | 0V | 0V | 5V | 0V | 0V | 0V | 5V | 5V | 0V |
| ERS(II) | -15V | 0V | 0V | 0V | 0V | 0V | 0V | 0V | 0V | 0V | 0V |
| READ | 3V | 0V | 1V | 1V | 0V | 0V | 0V | 0V | 5V | 5V | 0V |

MEMORY DEVICE

BACKGROUND OF THE INVENTION

1. Field of the Invention

The present invention relates to a memory device and an operation method thereof. More particularly, the present invention relates to a memory device for reducing an area of the memory device and enhancing an operation speed of the memory device and an operation method thereof.

2. Description of Related Art

Conventionally, the basic structure of metal oxide semiconductor (MOS) transistor has been broadly adopted in a variety of memory devices such as static random access memory (SRAM) or dynamic random access memory (DRAM) device. As the development of the semiconductor technology advances for increasing the integration of the semiconductor devices, the line width of the semiconductor device must be reduced. However, a variety of problems arise as the size of the cell of the memory device is reduced.

FIG. 1 is a schematic cross-sectional view illustrating a structure of a conventional MOS transistor. Referring to FIG. 1, the conventional MOS transistor 100 includes a substrate 102, an oxide layer 104, a gate 106, a source 108 and a drain 110. For an N-type MOS (NMOS) transistor, the substrate 102 includes a P-type substrate and the source 108 and the drain 110 are doped with N-type dopants. Alternatively, for a P-type MOS (PMOS) transistor, the substrate 102 includes a N-type substrate and the source 108 and the drain 110 are doped with P-type dopants. In general, the source 108 and the drain 110 are doped by thermal diffusion method or ion implantation method. The oxide layer 104 includes such as silicon oxide $SiO_2$, and the gate 106 includes metal. As shown in FIG. 1, the voltages applied to the substrate 102, the gate 106, the source 108 and the drain 110 are represented as Vsub, Vg, Vs and Vd respectively.

Hereinafter, the operation of the MOS transistor illustrated in FIG. 1 will be described. Referring to FIG. 1, it is assumed that the MOS transistor 100 is an NMOS transistor. When the gate voltage $Vg \leq 0$, even though the source voltage Vs or the drain Voltage Vd is not zero, the current between the source 108 and the drain 110 is extremely small and can be ignored. Therefore, the source 108 and the drain 110 is regarded as being isolated, and thus the NMOS transistor is turned off. When the gate voltage Vg>0 and larger than the threshold voltage Vt, the junction between the oxide layer 104 and the substrate 102 is strongly inverted to be an N-type channel. Therefore, the source 108 and the drain 110 are conducted, and thus the current between the source 108 and the drain 110 is not equal to zero, therefore the NMOS transistor is turned on.

FIG. 2 is a block diagram illustrating a memory cell of a conventional DRAM device. Referring to FIG. 2, a memory cell 200 includes an NMOS transistor 202, a capacitor 204, a bit line B and a word line W. The gate of the NMOS transistor 202 is connected to the word line W, the source of the NMOS transistor 202 is connected to the bit line B, and the drain of the NMOS transistor 202 is connected to the capacitor 204.

FIG. 3 is a schematic cross-sectional view illustrating a structure of the memory cell of the DRAM device shown in FIG. 2. Referring to FIG. 3, the gate 306 of the NMOS transistor 202 is connected to the word line W, the source 308 of the NMOS transistor 202 is connected to the bit line B, and the drain 310 of the NMOS transistor 202 is connected to the capacitor 204. In addition, the substrate 302 is a P-type substrate, and the source 308 and the drain 310 are dopes with N-type dopants.

As the line width of the memory device is reduced, the channel length between the source and the drain (e.g., the distance L1 shown in FIG. 1 or the distance L2 shown in FIG. 3) is also correspondingly reduced leading to a short channel effect due to reduction in the threshold voltage Vt and increase in the sub-threshold current. In addition, the shorting of channel length also leads to generation of hot electron effect due to increase in the electric field between the source and the drain. Therefore, the amount of the carriers in the channel near the drain is increased, and thus an electrical breakdown effect may be generated in the MOS transistor. Thus, generally the channel length has to be long enough to prevent a punch through effect. Accordingly, as the size of the MOS transistor or the memory device is minimized, the conventional design thereof is not applicable.

SUMMARY OF THE INVENTION

Therefore, the present invention is directed to a memory device and an operation method thereof for preventing the disadvantages of the memory device having bit lines formed by implantation.

In addition, the present invention is directed to a memory device and an operation method thereof, wherein the size and the area of the memory device is reduced and thereby enhancing the operation speed thereof.

According to one embodiment of the present invention, a memory device including, for example but not limited to, a plurality of word lines, a plurality of bit lines, at least four control lines and a plurality of memory cells is provided. The bit lines are disposed in a perpendicular direction relative to the word lines. Each memory cell is disposed at an intersection of one of the word lines and one of the bit lines, and every four memory cells in a sequence having a common word line are connected to the at least four control lines respectively. In addition, in each of the memory cells, the control line thereof is disposed between the bit line thereof and the word line thereof, and is parallel to the bit line thereof, wherein each of the memory cell is provided as a bit.

In one embodiment of the present invention, any one of the memory cells includes a first unit and a second unit. The first unit is connected to the bit line and the control line of the any one of the memory cells. The second unit is connected to the word line of the any one of the memory cells. In addition the second unit is connected to the first unit and another first unit of another one of the memory cells adjacent to the any one of the memory cells, wherein the second unit is provided as the bit.

In one embodiment of the present invention, the bit of the memory device is programmed by injecting a plurality of electrons into the bit. In addition, the step of injecting a plurality of electrons into the bit is accomplished by, for example, source-side injection of hot electrons into the bit.

In one embodiment of the present invention, the bit of the memory device is erased by removing electrons from the bit. In addition, the step of removing electrons from the bit is accomplished by, for example, injecting band to band hot holes into the bit.

In one embodiment of the present invention, the bit of the memory device is read by generating a read current from the bit.

In one embodiment of the present invention, each of the memory cells has a structure including, for example but not limited to, a substrate, a first dielectric layer, a gate, a second dielectric layer and a conductive layer. The first dielectric layer is disposed over the substrate. The gate is disposed over the first dielectric layer and connected to the control line of the each of the memory cells. The second dielectric layer is disposed over the gate and on the substrate, wherein a portion of the second dielectric layer on the substrate is provided as the bit. The conductive layer is disposed over the second dielectric layer and connected to the word line of the each of the memory cells. In addition, the bit line of the each of the memory cells is connected to a portion of the substrate under the first dielectric layer.

In one embodiment of the present invention, the substrate comprises a silicon substrate.

In one embodiment of the present invention, the first dielectric layer or the second dielectric layer comprises a multilayer structure. In addition, the multilayer structure includes, for example but not limited to, a bottom dielectric layer, a middle dielectric layer and a top dielectric layer. The bottom dielectric layer is disposed over the gate and the substrate, the middle dielectric layer is disposed over the bottom dielectric layer, and the top dielectric layer disposed over the middle dielectric layer.

In one embodiment of the present invention, the middle dielectric layer comprises high-dielectric material. In addition, in another embodiment of the present invention, a dielectric constant of the high-dielectric material is in a range of about 1 to about 500, or in a range of about 1 to about 200.

In one embodiment of the present invention, the bottom dielectric layer, the middle dielectric layer and the top dielectric layer comprise an oxide material, a nitride material and an oxide material respectively.

Accordingly, in the memory device of the present invention, since the bit lines are formed by inversion region, the short channel effect and the punch through effect as in the case of conventional memory device (in which the bit lines are formed by implantation) can be effectively reduced. In addition, since the control lines are disposed between the bit lines and the word lines, the size of the memory cells significantly reduced. Specially, the area of the memory cell of the invention may be reduced to about $4F^2$. Furthermore, since the memory cell of the present invention is programmed by source-side injection, the throughput of programming operation is enhanced.

One or part or all of these and other features and advantages of the present invention will become readily apparent to those skilled in this art from the following description wherein there is shown and described a preferred embodiment of this invention, simply by way of illustration of one of the modes best suited to carry out the invention. As it will be realized, the invention is capable of different embodiments, and its several details are capable of modifications in various, obvious aspects all without departing from the invention. Accordingly, the drawings and descriptions will be regarded as illustrative in nature and not as restrictive.

BRIEF DESCRIPTION OF THE DRAWINGS

The accompanying drawings are intended to provide further understanding of the invention, and are incorporated in and constitute a part of this specification. The drawings illustrate embodiments of the invention and, together with the description, serve to explain the principles of the invention.

DESCRIPTION OF THE EMBODIMENTS

The present invention is described in detail hereinafter with reference to the accompanying drawings, in which preferred embodiments of the invention are illustrated. The present invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
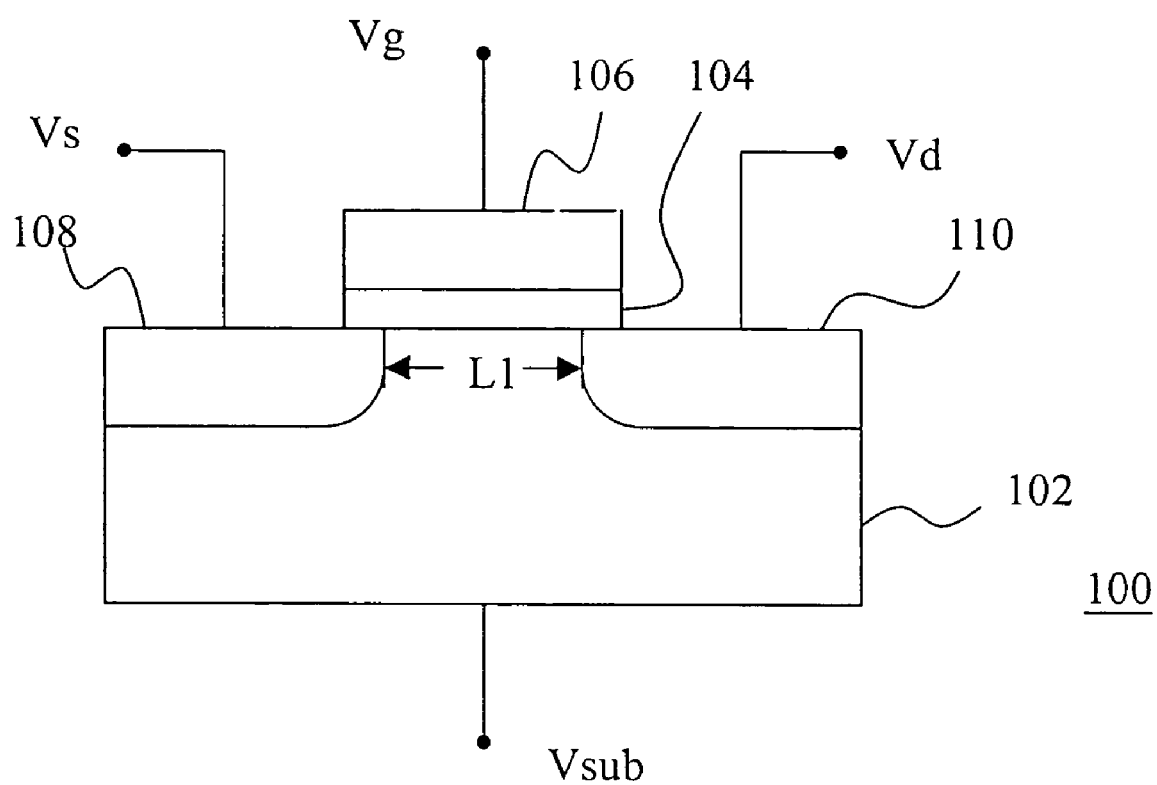
FIG. 1 is a schematic cross-sectional view illustrating a structure of a conventional MOS transistor.
Figure 2:
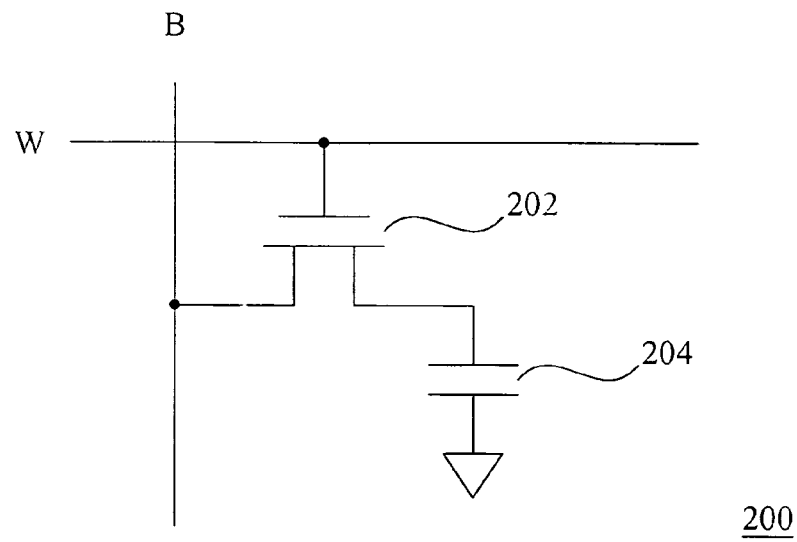
FIG. 2 is a block diagram illustrating a memory cell of a conventional DRAM device.
Figure 3:
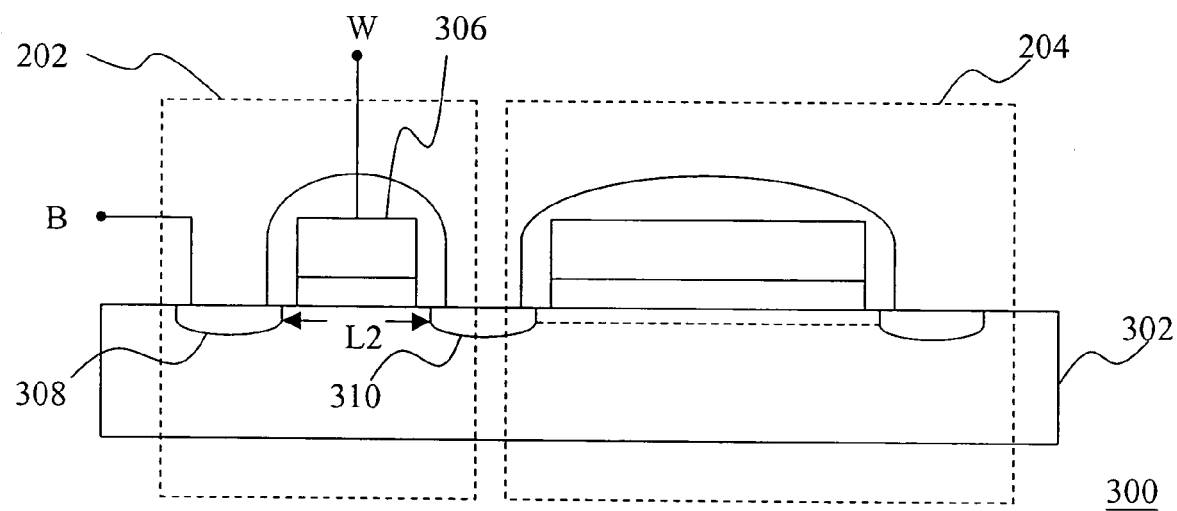
FIG. 3 is a schematic cross-sectional view illustrating a structure of the memory cell of the DRAM device shown in FIG. 2.
Figure 4:
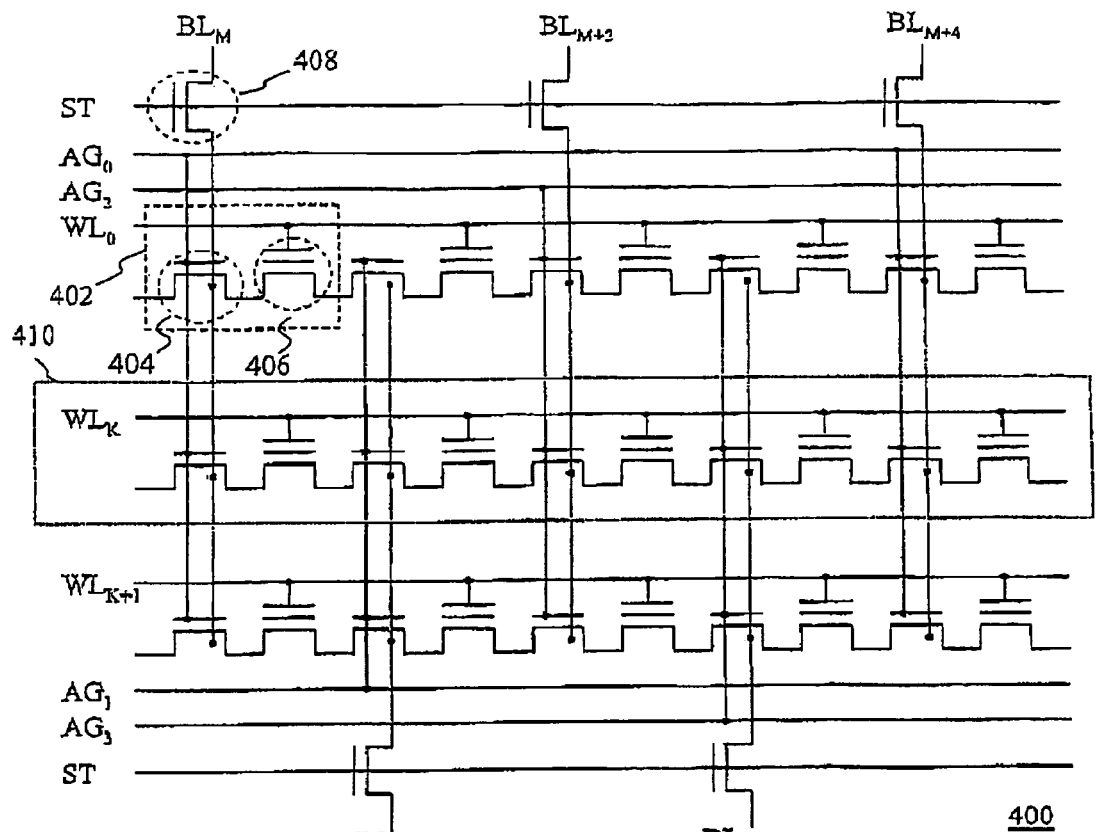
FIG. 4 is a circuit diagram illustrating a memory array according to one embodiment of the present invention.

FIG. 4 is a circuit diagram of a memory array according to one embodiment of the present invention. Referring to FIG. 4, the memory array 400 comprises, for example but not limited to, a plurality of memory cells 402, a plurality of word lines WL, a plurality of bit lines BL, and four control lines $AG_0$, $AG_1$, $AG_2$ and $AG_3$. The bit lines are perpendicular to the word lines, and the control lines are parallel to the bit lines. In addition, each memory cell 402 comprises, for example but not limited to, a first unit 404 and a second unit 406. Each first unit 404 is connected to a bit line BL and a control line AG. It is noted that, every four first units 404 in sequence in the memory array 400 are connected to four different control lines $AG_0$, $AG_1$, $AG_2$ and $AG_3$ respectively. Each second unit 406 is disposed and connected between every two first units 404 and is connected to a word line WL. In another embodiment of the present invention, each bit line BL is connected to the source or drain of a transistor 408, wherein the gate of the transistor 408 is controlled by a driving line ST. Hereinafter, in order to describe the operation of the memory array 400 in detail, the semiconductor structure of the memory array 400 is illustrated and explained.

Figure 5:
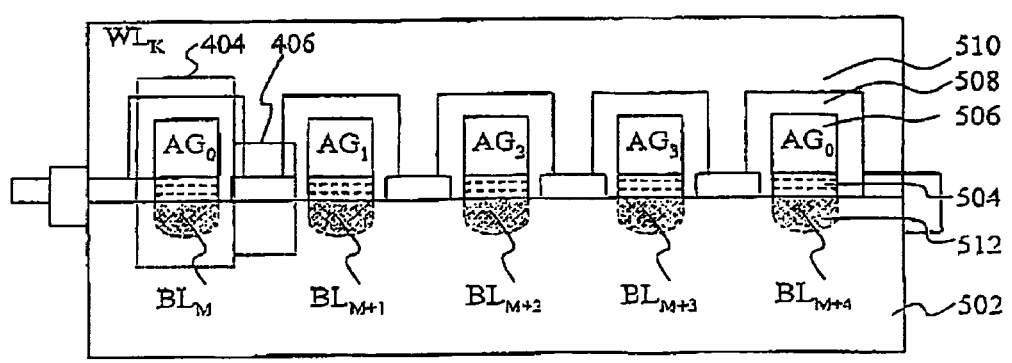
FIG. 5 is a cross-sectional view of block 410 shown in FIG. 4.

FIG. 5 is a cross-sectional view of block 410 shown in FIG. 4. Referring to FIG. 5, the memory structure 500 comprises, for example but not limited to, a substrate 502, a plurality of first dielectric layers 504, a plurality of gates 506, a second dielectric layer 508 and a conductive layer 510. The first dielectric layers 504 are formed over the substrate 502, and the gates 506 are formed over the first dielectric layers 504. The second dielectric layer 508 is formed over the gates 506 and the substrate 502. The conductive layer 510 is formed over the second dielectric layer 508. The substrate 502 comprises, for example but not limited to, a silicon substrate.

In one embodiment of the present invention, the second dielectric layer 508 comprises, for example but not limited to, a multilayer structure. For example, the multilayer structure is composed of a bottom dielectric layer (not shown)

disposed over the gates 506 and the substrate 502, a middle dielectric layer (not shown) disposed over the bottom dielectric layer, and a top dielectric layer (not shown) disposed over the middle dielectric layer. In one embodiment of the present invention, the middle dielectric layer is composed of high-dielectric material. In addition, in another embodiment of the present invention, a dielectric constant of the high-dielectric material is in a range of about 1 to about 500, or in a range of about 1 to about 200. In another embodiment of the present invention, the bottom, middle and top dielectric layers are composed of oxide, nitride and oxide (O/N/O) materials respectively.

In one embodiment of the present invention, the first dielectric layers 504 comprises, for example but not limited to, a single layer or a multilayer structure. The single layer is composed of, for example, oxide material. The multilayer structure of the first dielectric layers 504 may be same or similar to the multilayer structure of the second dielectric layer 508 described above.

Referring to FIG. 5, the word line, for example but not limited to, $WL_K$, of the memory array 400 shown in FIG. 4 is connected to the conductive layer 510. The control lines $AG_0$, $AG_1$, $AG_2$ and $AG_3$ shown in FIG. 4 are connected to four gates 506 in sequence respectively. The bit lines shown in FIG. 4 are connected to a plurality of inversion regions 512, wherein the inversion regions 512 are illustrated with dotted lines since the inversion regions 512 are induced only when a voltage is applied to the gates 506 over the inversion regions 512. As shown in FIG. 5, the bit lines $BL_M$, $BL_{M+1}$, $BL_{M+2}$, and $BL_{M+3}$ are connected to the inversion regions 512 in accordance with the control lines $AG_0$, $AG_1$, $AG_2$ and $AG_3$ respectively. It is noted that, the inversion regions 512 are not formed by using conventional implantation process, and is formed by the strong inversion effect thereof.

Figures 6, 7:
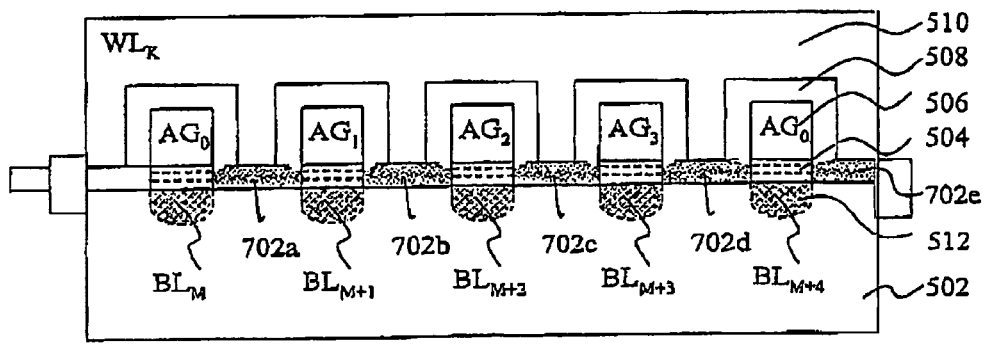
FIG. 6 is a table of operation parameters of a memory array according to one embodiment of the present invention.
FIG. 7 is a cross-sectional view of a memory array during operation according to one embodiment of the present invention.

FIG. 6 is a table listing the operation parameters of a memory array according to one embodiment of the present invention. FIG. 7 is a cross-sectional view of a memory array during operation according to one embodiment of the present invention. Hereinafter, the operation of the memory 400 shown in FIG. 4 will be described in detail with respect to FIG. 6 and FIG. 7. In general, the operation of a memory array 400 of the present invention comprises, for example but not limited to, programming, erasing and reading operations of the memory cells 402. In one embodiment of the present invention, the programming operation includes, for example but not limited to, putting electrons into a local trap such as the regions 702a (or 702b, 702c etc.) shown in FIG. 7. The erasing operation includes an erasing operation of a single bit and an erasing operation of the whole memory array. The erasing operation of a single bit includes removing electrons from the local trap of the single bit, and the erasing operation of a plurality of bits includes removing electrons from the local trap of all the corresponding bits. The reading operation includes, for example but not limited to, creating read current from the local trap. It should be noted that, the operation parameters illustrated in FIG. 6 are only provided as an exemplary example, and cannot be used to limit the scope of the present invention. In one embodiment of the present invention, all the operation parameters are, for example but not limited to, in a region of about −100V to about 100V.

As to a programming operation, the operation parameters in one embodiment of the present invention are illustrated in the row PGM of FIG. 6. First, if a bit having a local trap 702b between the bit lines $BL_{M+1}$ and $BL_{M+2}$ is to be programmed, the gates $AG_0$, $AG_1$, $AG_2$ and $AG_3$ are applied with voltages 0V, 5V, 1V and 8V respectively. It is noted that the inversion region 512 of the bit line $BL_M$ is not induced since the voltage applied at the gates $AG_0$ is 0. Therefore, the inversion regions 512 of bit lines $BL_{M+1}$, $BL_{M+2}$ and $BL_{M+3}$ are induced and the threshold voltage of inversion region of bit line $BL_{M+1}$ is less than threshold voltage of inversion region of bit line $BL_{M+3}$. In addition, the word line $WL_K$ is applied with voltage 5V, the bit lines $BL_{M+1}$ and $BL_{M+3}$ are applied with voltages 4.5V and 0V, and the bit line $BL_{M+2}$ is floated. Therefore, since the voltage of the gate $AG_3$ over the $BL_{M+3}$ are larger than the voltage of the gate $AG_1$ over the $BL_{M+1}$, induced source-side hot electrons are injected into the local trap 702b of the bit. In addition, the word line $WL_{K+1}$ is applied with voltage 0V, and the bit lines $BL_M$ and $BL_{M+4}$ are applied with voltages 4.5V and 0V respectively (the same as the bit lines $BL_{M+1}$ and $BL_{M+3}$ respectively) to inhibit the programming of other bits. Finally, electrons are put into the local trap 702b of the bit shown in FIG. 7. Accordingly, since the bit of the memory cell of the present invention is programmed by source-side injection of hot electrons, the throughput of programming operation is enhanced.

As to the erasing operation of a single bit, the operation parameters according to an embodiment of the present invention listed in the row ERS(I) of FIG. 6. First, if a bit having a local trap 702b between the bit lines $BL_{M+1}$ and $BL_{M+2}$ is to be erased, the gates $AG_1$ and $AG_2$ are applied with voltages 5V and 5V respectively. Therefore, the inversion regions 512 of bit lines $BL_{M+1}$ and $BL_{M+2}$ are induced. In addition, the word line $WL_K$ is applied with voltage −5V, and the bit lines $BL_{M+1}$ and $BL_{M+2}$ are applied with voltages 0V and 5V respectively. Therefore, induced band to and hot holes are injected into the local trap 702b of bit, and thus the stored electrons in the local trap 702b of bit are electrically neutralized. In addition, the word line $WL_{K+1}$ is applied with voltage 0V, and the bit lines $BL_M$ and $BL_{M+4}$ are applied with voltages 0V and 0V to inhibit the erasing of other bits. Finally, electrons are removed from the local trap 702b of the bit shown in FIG. 7. Accordingly, since the bit of the memory cell of the present invention is erased by band to band injection of hot holes, the throughput of erasing operation is enhanced.

As to the bit erasing operation of a plurality of bits, the operation parameters according to an embodiment of the present invention is listed in the row ERS(II) of FIG. 6. First, if all the bits corresponding to the word line $WL_K$ are to be erased (e.g., all the local traps such as 702a to 702e of the bits are to be erased), all the gates $AG_0$, $AG_1$, $AG_2$ and $AG_3$ are applied with voltage 0V respectively. In addition, the word line $WL_K$ is applied with voltage −15 V, and all the bit lines connected to the word line $WL_K$ (e.g., all the bit lines $BL_M$, $BL_{M+1}$, $BL_{M+2}$, $BL_{M+3}$ and $BL_{M+4}$) are applied with voltage 0V respectively. Therefore, induced channel hot holes are injected into all the local traps of the bits corresponding to the word line $WL_K$, and thus the stored electrons thereof are electrically neutralized. Finally, electrons are removed from the local traps of the bits corresponding to the word line $WL_K$ shown in FIG. 7.

As to the reading operation, the operation parameters in one embodiment of the present invention are illustrated in the row READ of FIG. 6. First, if a bit having a local trap 702b between the bit lines $BL_{M+1}$ and $BL_{M+2}$ is to be read, the gates $AG_1$ and $AG_2$ are both applied with voltage 5V respectively. Therefore, the inversion regions 512 of bit lines $BL_{M+1}$ and $BL_{M+2}$ are induced. In addition, the word line $WL_K$ is applied with voltage 3V, and the bit lines $BL_{M+1}$ and $BL_{M+2}$ are applied with voltages 1V and 0V respectively. Therefore, a read current is induced from the local trap 702b of the bit. In addition, the word line $WL_{K+1}$ is applied with voltage 0V, and the bit lines $BL_M$ and $BL_{M+4}$ are applied with voltages 1V and 0V (the same as the bit lines $BL_{M+1}$ and $BL_{M+3}$ respectively) to inhibit disturbance of other bits. Finally, the bit is read by receiving the read current generated from the local trap 702b of the bit.

Figure 8:
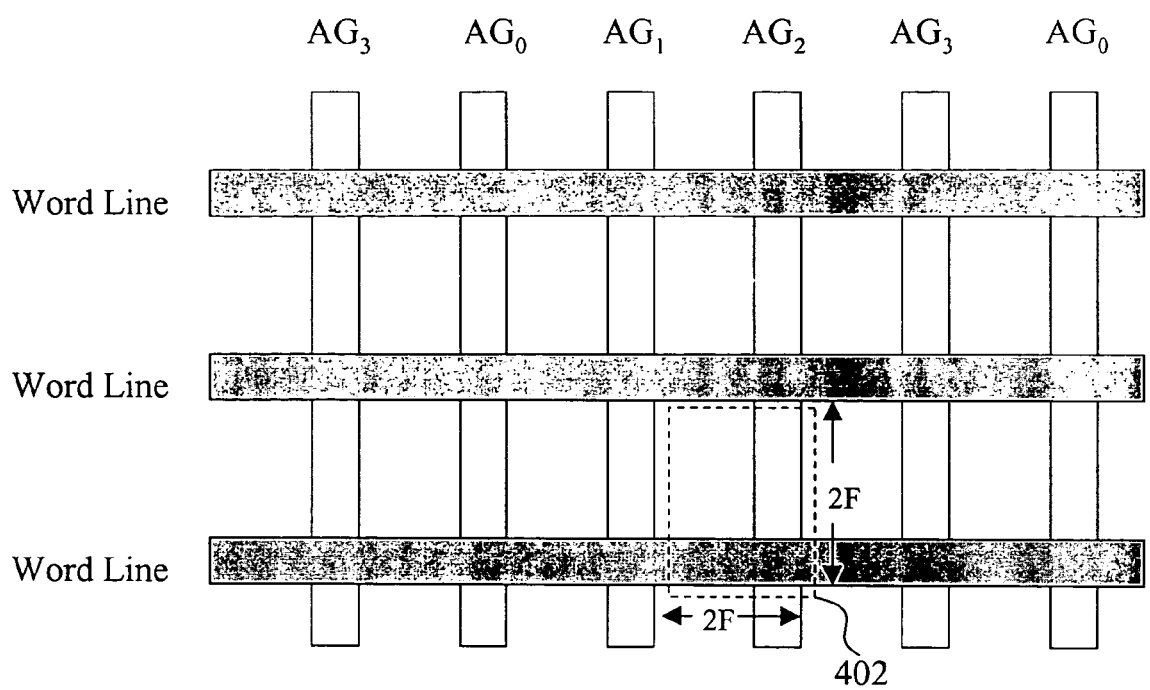
FIG. 8 is a top view of a memory array according to one embodiment of the present invention.

FIG. 8 is a top view of a memory array according to one embodiment of the present invention. Referring to FIG. 8, the memory cell 402 includes a corresponding word line and control line AG, wherein the bit lines are not illustrated in FIG. 8, however, each bit line is disposed under a corresponding control line AG. Referring to FIG. 4, since the control lines are disposed between the bit lines and the word lines and, the size of the memory cells are considerable minimized. In one embodiment of the present invention, the size of each memory cell may be reduced to, for example, 2F, and thus the area of each memory cell is about $4F^2$ um$^2$ (wherein F is the minimum feature size in conventional lithography process).

Accordingly, in the memory device of the present invention, since the bit lines are formed by inversion region, the short channel effect and punch through effect as in the case of the conventional memory device (in which the bit lines are formed by implantation) are reduced. In addition, since the control lines are disposed between the bit lines and the word lines and, the size of the memory cells is significantly reduced. Specially, the area of the memory cell of the invention may be reduced to about $4F^2$. Furthermore, since the memory cell of the present invention is programmed by source-side injection, the throughput of programming operation is enhanced.

The foregoing description of the preferred embodiment of the present invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A memory device, comprising:
   a plurality of word lines;
   a plurality of bit lines, disposed in a perpendicular direction relative to the word lines;
   at least four control lines; and
   a plurality of memory cells, wherein each memory cell is disposed at an intersection of one of the word lines and one of the bit lines, and every four of the memory cells in sequence having a common word line are connected to the four control lines respectively, wherein the four control lines are not commonly shared and in each of the memory cells, the control line thereof is disposed between the bit line thereof and the word line thereof, and is parallel to the bit line thereof, wherein each of the memory cell is provided as a bit.

2. The memory device of claim 1, wherein any one of the memory cells comprises:
   a first unit, connected to the bit line and the control line of the any one of the memory cells; and
   a second unit, connected to the word line of the any one of the memory cells, and the second unit is connected to the first unit and another first unit of another one of the memory cells adjacent to the any one of the memory cells, wherein the second unit is provided as the bit.

3. The memory device of claim 1, wherein the bit of the memory device is programmed by injecting a plurality of electrons into the bit.

4. The memory device of claim 3, wherein a step of injecting a plurality of electrons into the bit is accomplished by a source-side injection of hot electrons.

5. The memory device of claim 1, wherein the bit of the memory device is erased by removing electrons from the bit.

6. The memory device of claim 5, wherein a step of removing electrons from the bit is accomplished by injecting band to band hot holes into the bit.

7. The memory device of claim 1, wherein the bit of the memory device is read by generating a read current from the bit.

8. The memory device of claim 1, wherein each of the memory cells has a structure comprising:
   a substrate;
   a first dielectric layer, disposed over the substrate;
   a gate, disposed over the first dielectric layer and connected to the control line of the each of the memory cells;
   a second dielectric layer, disposed over the gate and on the substrate, wherein a portion of the second dielectric layer on the substrate is provided as the bit; and
   a conductive layer, disposed over the second dielectric layer and connected to the word line of the each of the memory cells;
   wherein the bit line of the each of the memory cells is connected to a portion of the substrate under the first dielectric layer.

9. The memory device of claim 8, wherein the substrate comprises a silicon substrate.

10. The memory device of claim 8, wherein the first dielectric layer or the second dielectric layer comprises a multilayer structure.

11. The memory device of claim 10, wherein the multilayer structure comprises:
    a bottom dielectric layer, disposed over the gate and the substrate;
    a middle dielectric layer, disposed over the bottom dielectric layer; and
    a top dielectric layer disposed over the middle dielectric layer.

12. The memory device of claim 11, wherein the middle dielectric layer comprises high-dielectric material.

13. The memory device of claim 12, wherein a dielectric constant of the high-dielectric material is in a range of about 1 to about 500.

14. The memory device of claim 12, wherein a dielectric constant of the high-dielectric material is in a range of about 1 to about 200.

15. The memory device of claim 11, wherein the bottom dielectric layer, the middle dielectric layer and the top dielectric layer comprise an oxide layer, a nitride layer and an oxide layer respectively.

* * * * *